United States Patent
Ng et al.

(10) Patent No.: US 12,463,140 B2
(45) Date of Patent: Nov. 4, 2025

(54) FLEXIBLE INTERPOSER FOR SEMICONDUCTOR DIES

(71) Applicant: Micron Technology, Inc., Boise, ID (US)

(72) Inventors: Hong Wan Ng, Singapore (SG); Seng Kim Ye, Singapore (SG); Kelvin Aik Boo Tan, Singapore (SG); See Hiong Leow, Singapore (SG); Ling Pan, Singapore (SG)

(73) Assignee: Micron Technology, Inc., Boise, ID (US)

( * ) Notice: Subject to any disclaimer, the term of this patent is extended or adjusted under 35 U.S.C. 154(b) by 595 days.

(21) Appl. No.: 17/821,272

(22) Filed: Aug. 22, 2022

(65) Prior Publication Data
US 2024/0063135 A1    Feb. 22, 2024

(51) Int. Cl.
*H01L 23/538* (2006.01)
*H01L 21/48* (2006.01)
*H01L 23/498* (2006.01)
*H01L 25/065* (2023.01)
*H01L 23/00* (2006.01)

(52) U.S. Cl.
CPC ...... *H01L 23/5387* (2013.01); *H01L 21/4853* (2013.01); *H01L 21/4857* (2013.01); *H01L 21/486* (2013.01); *H01L 23/49811* (2013.01); *H01L 23/49822* (2013.01); *H01L 23/49838* (2013.01); *H01L 23/4985* (2013.01); *H01L 23/49894* (2013.01); *H01L 23/5383* (2013.01); *H01L 23/5386* (2013.01); *H01L 25/0657* (2013.01); *H01L 24/48* (2013.01); *H01L 25/0652* (2013.01); *H01L 2224/48227* (2013.01); *H01L 2225/06524* (2013.01); *H01L 2225/06527* (2013.01); *H01L 2924/1434* (2013.01)

(58) Field of Classification Search
CPC ............ H01L 25/043; H01L 25/0657; H01L 25/0652; H01L 25/074; H01L 25/0756
See application file for complete search history.

(56) References Cited

U.S. PATENT DOCUMENTS

| | | | |
|---|---|---|---|
| 2010/0038767 A1* | 2/2010 | Moriya | H01L 23/5385 257/E25.027 |
| 2020/0013756 A1* | 1/2020 | Pon | H01L 24/48 |
| 2023/0335472 A1* | 10/2023 | Schuderer | H01L 25/071 |
| 2024/0128154 A1* | 4/2024 | Morita | C09J 163/00 |

* cited by examiner

*Primary Examiner* — Evan G Clinton
(74) *Attorney, Agent, or Firm* — Harrity & Harrity, LLP (57) ABSTRACT

Implementations described herein relate to various semiconductor device assemblies. In some implementations, a semiconductor device assembly includes a first semiconductor die, a second semiconductor die in a stacked arrangement with the first semiconductor die, and a flexible interposer disposed between the first semiconductor die and the second semiconductor die. The flexible interposer may include a first flexible layer, a second flexible layer, and a conductive trace disposed between the first flexible layer and the second flexible layer. A spacer portion of the flexible interposer may space the first semiconductor die from the second semiconductor die. A connecting portion of the flexible interposer may extend from the spacer portion beyond edges of the first semiconductor die and the second semiconductor die.

35 Claims, 9 Drawing Sheets

FLEXIBLE INTERPOSER FOR SEMICONDUCTOR DIES

TECHNICAL FIELD

The present disclosure generally relates to semiconductor devices and methods of forming semiconductor devices. For example, the present disclosure relates to a flexible interposer for semiconductor dies.

BACKGROUND

A semiconductor package includes a casing that contains one or more semiconductor devices, such as integrated circuits. Semiconductor device components may be fabricated on semiconductor wafers before being diced into dies and then packaged. A semiconductor package protects internal components from damage and includes means for connecting internal components to external components (e.g., a circuit board), such as via balls, pins, or leads. A semiconductor package is sometimes referred to as a semiconductor device assembly.

DETAILED DESCRIPTION

A semiconductor package may include multiple semiconductor dies in a stacked arrangement to reduce a footprint of the dies. Spacers, which may be made of silicon, may be disposed between each of the dies of the stack to provide vertical separation between adjacent dies. Generally, the separation between adjacent dies should be sufficient to facilitate an electrical connection of a semiconductor die (e.g., a lower semiconductor die of the adjacent semiconductor dies) to a substrate via wire bonding. For example, with wire bonding, a wire connected to a bond pad of the semiconductor die may project vertically from the die, and the wire may include a loop that redirects the wire downward for connection to a bond pad of the substrate. Thus, wire bonding may be damaged if the separation between adjacent dies is too small. Moreover, if the separation between adjacent dies is too small, there may be a limited area for running wires between a semiconductor die and the substrate, thereby risking shorts caused by contact between wires or contact between a wire and another semiconductor die.

Accordingly, spacers used for a stack of semiconductor dies may be relatively thick to accommodate wire bonding, thereby increasing an overall height of the stack of dies. As a result, a semiconductor package including the stack of semiconductor dies may have a reduced top mold clearance, which is a distance between a top-most die of the stack and a top of the package (e.g., a casing of the package). With reduced top mold clearance, the package has reduced strength, and the stack of semiconductor dies are more susceptible to damage.

Some implementations described herein are directed to a flexible interposer, and a method of using the flexible interposer, that facilitates a reduction of an amount of separation between adjacent semiconductor dies in a stacked arrangement. For example, the flexible interposer may be disposed between adjacent semiconductor dies to provide separation between the dies. Moreover, the flexible interposer may include one or more conductive traces embedded in non-conductive material of the flexible interposer. The conductive trace(s) may provide electrical connection between a semiconductor die and a substrate of a package that includes the stacked dies, thereby eliminating the need for wire bonding. In other words, the flexible interposer may provide protection for the conductive trace(s) against damage or shorting that may occur using wire bonding, thereby allowing for the amount of separation between adjacent semiconductor dies to be reduced compared to a conventional spacer, as described above. By reducing the amount of separation between the dies, an overall height of the stacked dies may be reduced, which increases a top mold clearance of the package. Accordingly, the package may have improved strength that provides improved protection of the stacked dies.

In some implementations, the conductive trace(s) of the flexible interposer may be configured to provide signal redistribution, may be configured with matched lengths, and/or may be configured in various patterns or with optimized properties (e.g., trace width). In this way, the flexible interposer facilitates design improvements for the package that otherwise could not be achieved using wire bonding. For example, a configuration of the flexible interposer for signal redistribution may eliminate the need for complex signal routing through the package substrate and/or provide greater freedom with respect to the placement of the stacked dies and/or other components in the package.

Figure 1:
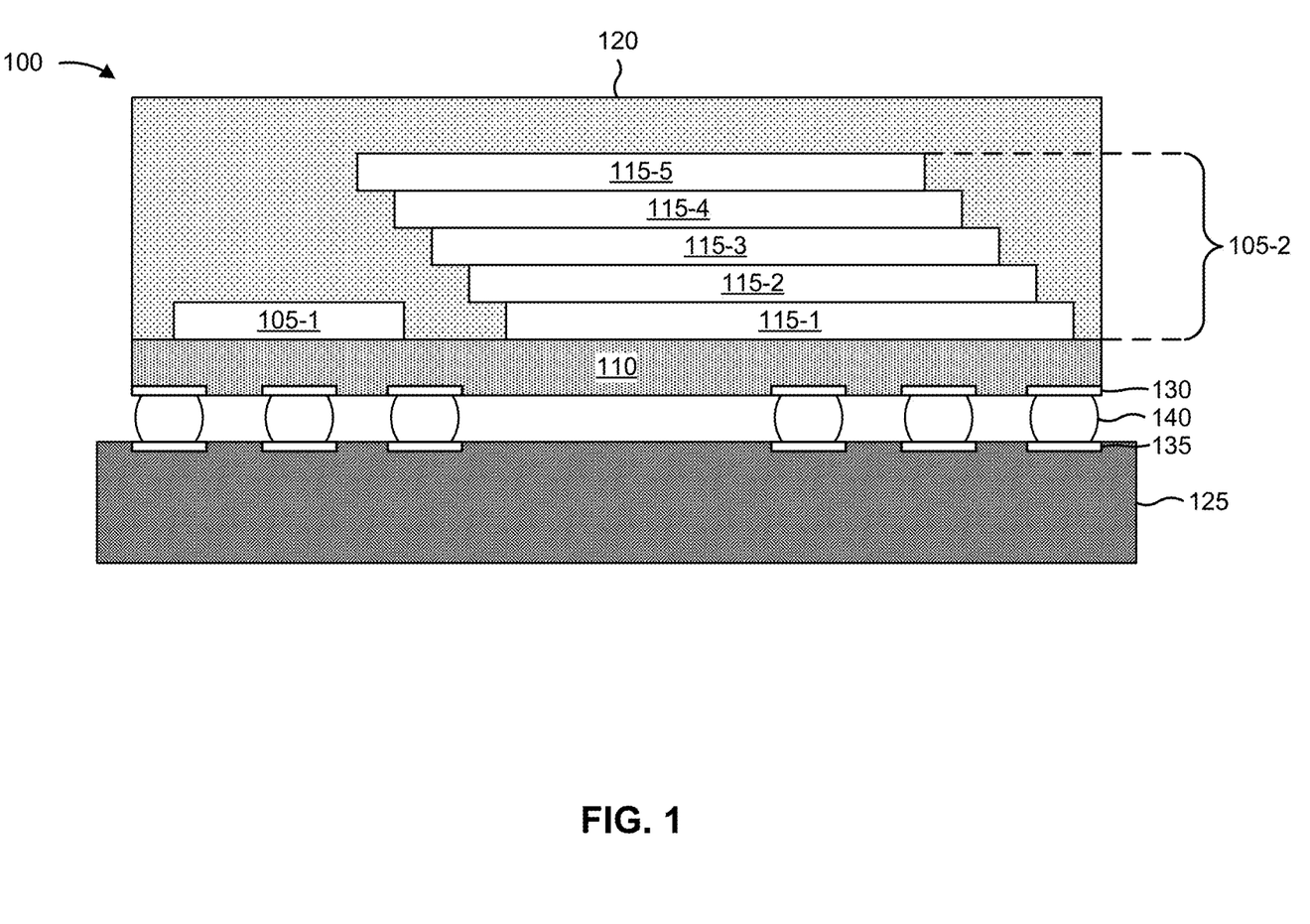
FIG. 1 is a diagram of an example apparatus that may include assemblies or apparatuses described herein.

FIG. 1 is a diagram of an example apparatus 100 that may include assemblies or apparatuses described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher-level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher-level system.

As indicated above, FIG. 1 is provided as an example. Other examples may differ from what is described with regard to FIG. 1.

Figure 2:
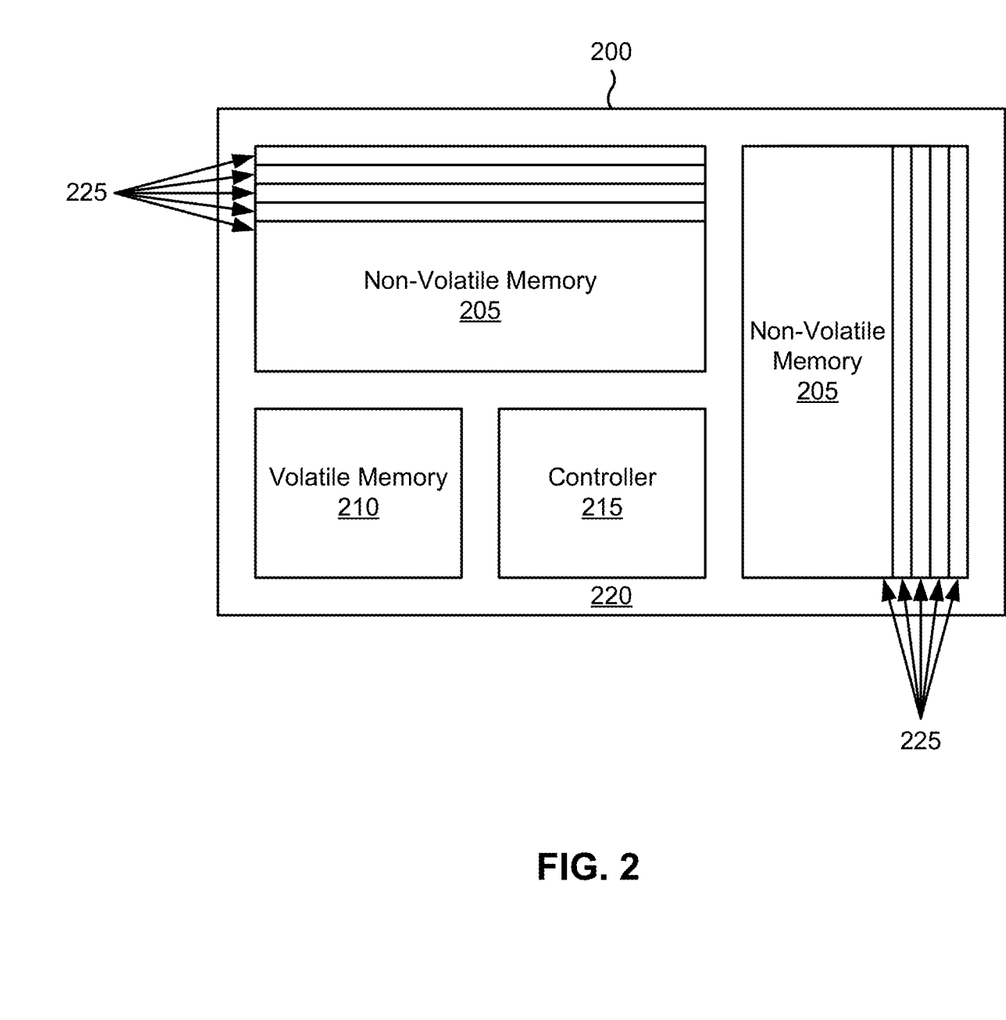
FIG. 2 is a diagram of an example memory device that may include assemblies or apparatuses described herein.

FIG. 2 is a diagram of an example memory device 200 that may include assemblies or apparatuses described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3:
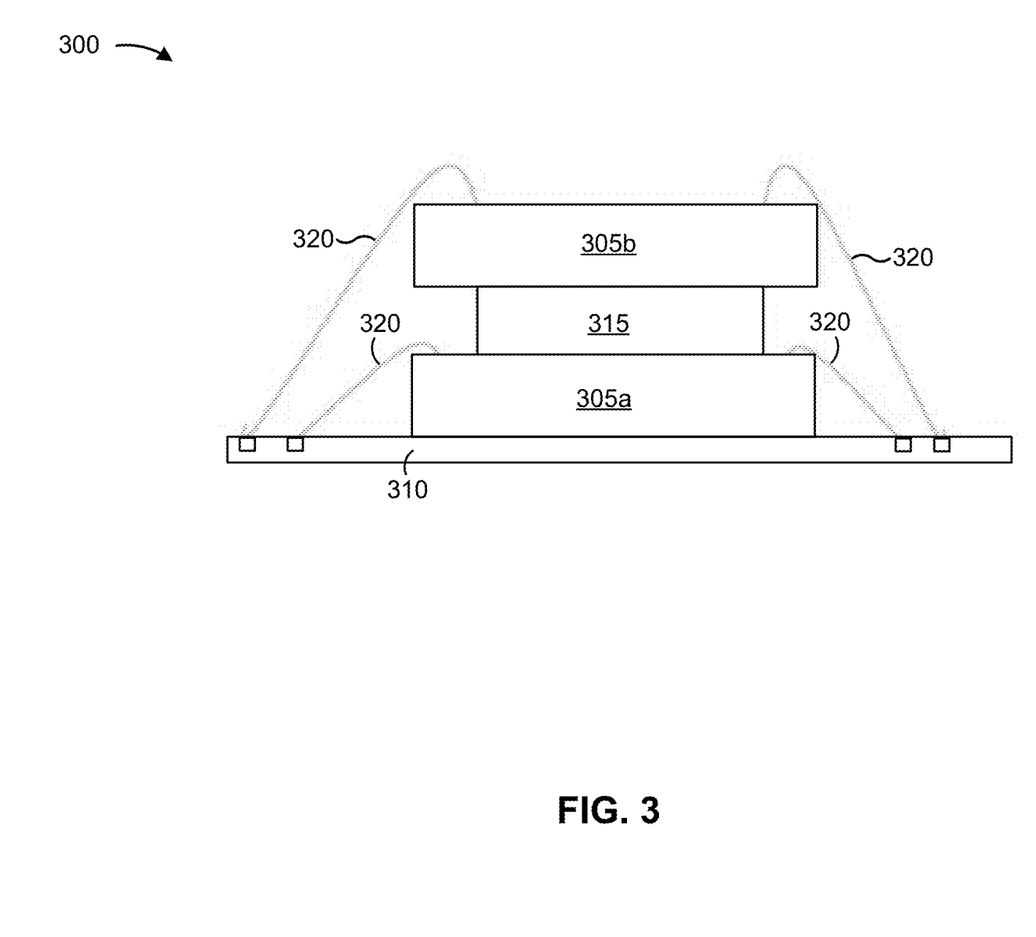
FIG. 3 is a diagram of an example of a stack of semiconductor dies on a substrate.

FIG. 3 is a diagram of an example of a stack 300 of semiconductor dies 305 on a substrate 310. As shown, a spacer 315 may be disposed between adjacent dies 305a, 305b of the stack 300. The spacer 315 may comprise, consist of, or consist essentially of silicon. For example, the spacer 315 may be non-conductive. The spacer 315 may provide vertical separation between the dies 305a, 305b, and an amount of the separation may correspond to a thickness of the spacer 315 as well as a thickness of die attach films (DAFs, not shown) used to attach the spacer 315 to the dies 305a, 305b. In some examples, the thickness of the spacer 315 may be approximately 60 micrometers (μm), and a thickness of the DAFs may be approximately 20 μm. That is, an overall separation between dies 305a, 305b may be approximately 80 μm. This amount of separation facilitates the use of wire bonding to electrically connect the dies 305a, 305b to the substrate 310. For example, as shown, wires 320 may project upwardly from surfaces of the dies 305a, 305b, and loops of the wires 320 may redirect the wires downward for connection to the substrate 310, as described above. This configuration requires that the thickness of spacer 315 is sufficient to prevent damage to, or shorting of, the wires 320. As a result, an overall height of the stack 300 is increased by use of wire bonding and the spacer 315. Some implementations described herein address these and other issues.

As indicated above, FIG. 3 is provided as an example. Other examples may differ from what is described with regard to FIG. 3.

Figure 4:
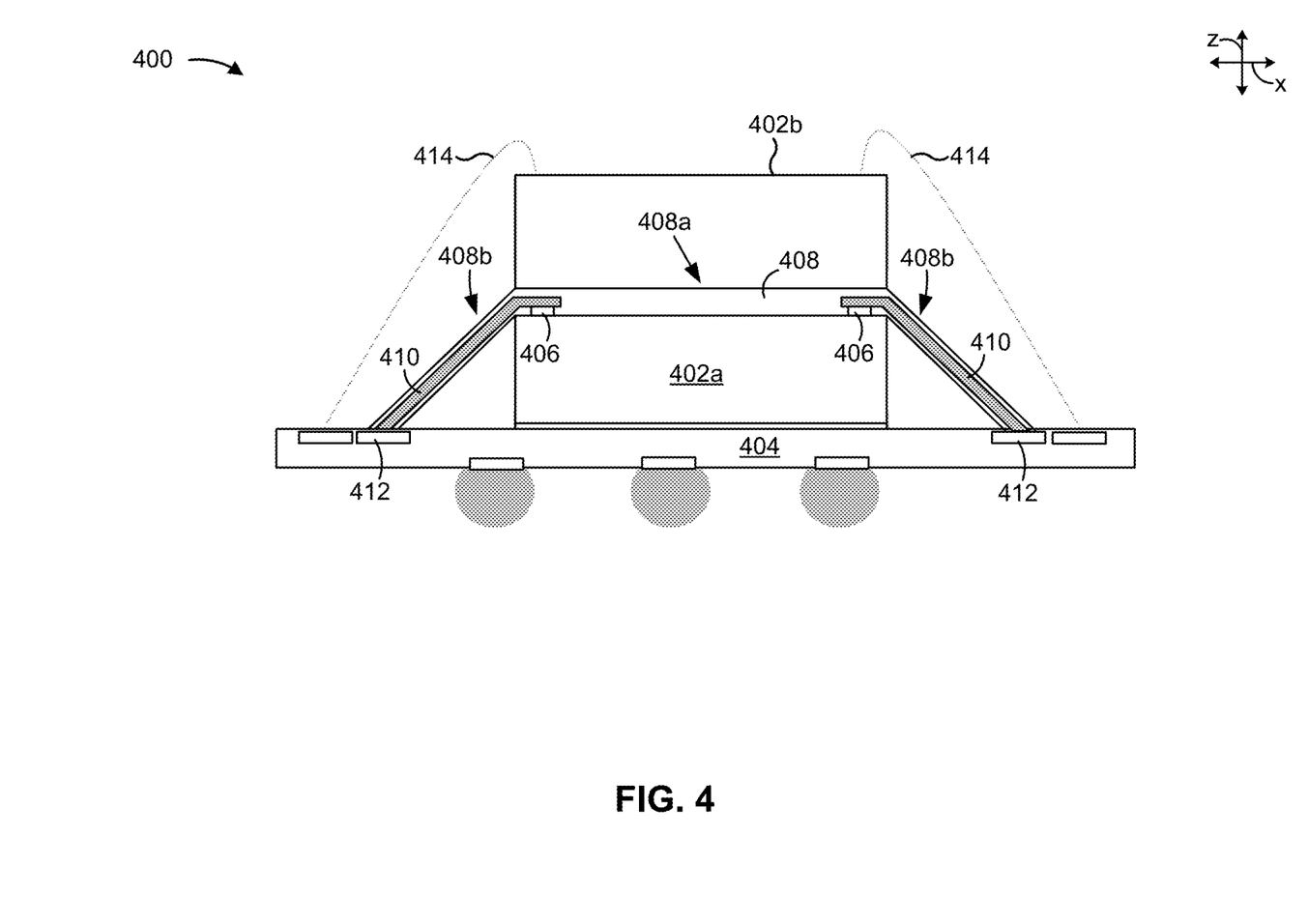
FIG. 4 is a diagram of an example apparatus that includes a flexible interposer.

FIG. 4 is a diagram of an example apparatus 400 that includes a flexible interposer. The apparatus 400 may be, or may include, a semiconductor device assembly, as described herein. The apparatus 400 may include a plurality of semiconductor dies 402 in a stacked arrangement. For example, as shown in FIG. 4, the apparatus 400 may include a first semiconductor die 402a, and a second semiconductor die 402b in a stacked arrangement with the first semiconductor die 402a. The stacked arrangement of the semiconductor dies 402 may be a shingle stacking or another suitable type of stacking. In some implementations, the first semiconductor die 402a may be a first memory device and the second semiconductor die 402b may be a second memory device, as described herein. The apparatus 400 may include a substrate 404 (e.g., a circuit board), and the stacked semiconductor dies 402 may be disposed on the substrate 404.

Each of the semiconductor dies 402 may include one or more bond pads 406 on a surface of the semiconductor die 402. For example, as shown, bond pads 406 for the first semiconductor die 402a may be on a surface of the first semiconductor die 402a. The bond pads 406 for the first semiconductor die 402a may facilitate an electrical connection for the first semiconductor die 402a.

A flexible interposer 408 may be disposed between (e.g., in contact with) the first semiconductor die 402a and the second semiconductor die 402b. In some implementations, DAF (not shown) above and below the flexible interposer 408 may attach the flexible interposer 408 to the first semiconductor die 402a and the second semiconductor die 402b. One or more conductive traces 410 (e.g., a plurality of conductive traces 410) may be embedded in the flexible interposer 408. For example, the conductive traces 410 may be disposed between flexible layers of the flexible interposer 408, as described in connection with FIG. 5. The conductive traces 410 may be electrically connected to the first semiconductor die 402a and/or the second semiconductor die 402b. For example, the flexible interposer 408 may include one or more openings through which the conductive traces 410 electrically connect to the bond pads 406. In some implementations, the conductive traces 410 may be electrically connected to the bond pads 406 by tape-automated bonding.

The flexible interposer 408 may include a spacer portion 408a that spaces the first semiconductor die 402a from the second semiconductor die 402b. The flexible interposer 408 may also include one or more connecting portions 408b that extend from the spacer portion 408a beyond edges of the semiconductor dies 402. As shown, the flexible interposer 408 may include a first connecting portion 408b and a second connecting portion 408b, and the spacer portion 408a may be between the first connecting portion 408b and the second connecting portion 408b.

The conductive traces 410 may extend within the connecting portions 408b. For example, a first conductive trace 410 may extend within the first connecting portion 408b and a second conductive trace 410 may extend within the second connecting portion 408b, as shown. The connecting portions 408b may extend from the spacer portion 408a to the substrate 404. The conductive traces 410, extending within the connecting portions 408b, may be electrically connected with pads 412 (e.g., lead fingers) of the substrate 404. In some implementations, the conductive traces 410 may be electrically connected to the pads 412 by tape-automated bonding.

As shown in FIG. 4, the second semiconductor die 402b may be electrically connected to the substrate 404 by wire bonding using one or more wires 414, as described herein. In other words, the apparatus 400 may have a hybrid configuration that uses the flexible interposer 408 and wire bonding for electrically connecting the semiconductor dies 402 to the substrate 404. For example, in this hybrid configuration, the semiconductor die 402 on the top of the stacked semiconductor dies 402 may have an electrical connection by wire bonding, while semiconductor dies 402 below the top may have an electrical connection by the flexible interposer 408. Thus, an overall height of the stacked semiconductor dies 402 is not increased by the use of wire bonding at the top of the stacked semiconductor dies 402.

In some implementations, electrical connections between the semiconductor dies 402 and the substrate 404 may be free of wire bonds (e.g., there are no wire bonds between the semiconductor dies 402 and the substrate 404), in a similar manner as described below in connection with FIGS. 6A-6B. For example, an additional flexible interposer 408 may be disposed on the second semiconductor die 402b, in a similar manner as described in connection with FIGS. 6A-6B.

By using the flexible interposer 408, wire bonding between the stacked semiconductor dies 402 may be eliminated. Accordingly, the spacing between the semiconductor dies 402 provided by the spacer portion 408a of the flexible interposer 408 may be reduced, thereby reducing an overall height of the stacked semiconductor dies 402 and improving a top mold clearance of the apparatus 400. In some implementations, the apparatus 400 may correspond to the apparatus 100. For example, the stacked semiconductor dies 402 may correspond to the integrated circuit 105-2 used in the apparatus 100, described herein. In some implementations, the apparatus 400 may correspond to the memory device 200. For example, the stacked semiconductor dies 402 may correspond to the non-volatile memory 205 used in the memory device 200, described herein. Although shown with two semiconductor dies 402 in a stacked arrangement, the apparatus 400 may include three or more semiconductor dies 402 in a stacked arrangement. Here, a flexible interposer 408 may be disposed between each pair of adjacent semiconductor dies 402 of the apparatus 400.

As indicated above, FIG. 4 is provided as an example. Other examples may differ from what is described with regard to FIG. 4.

Figure 5:
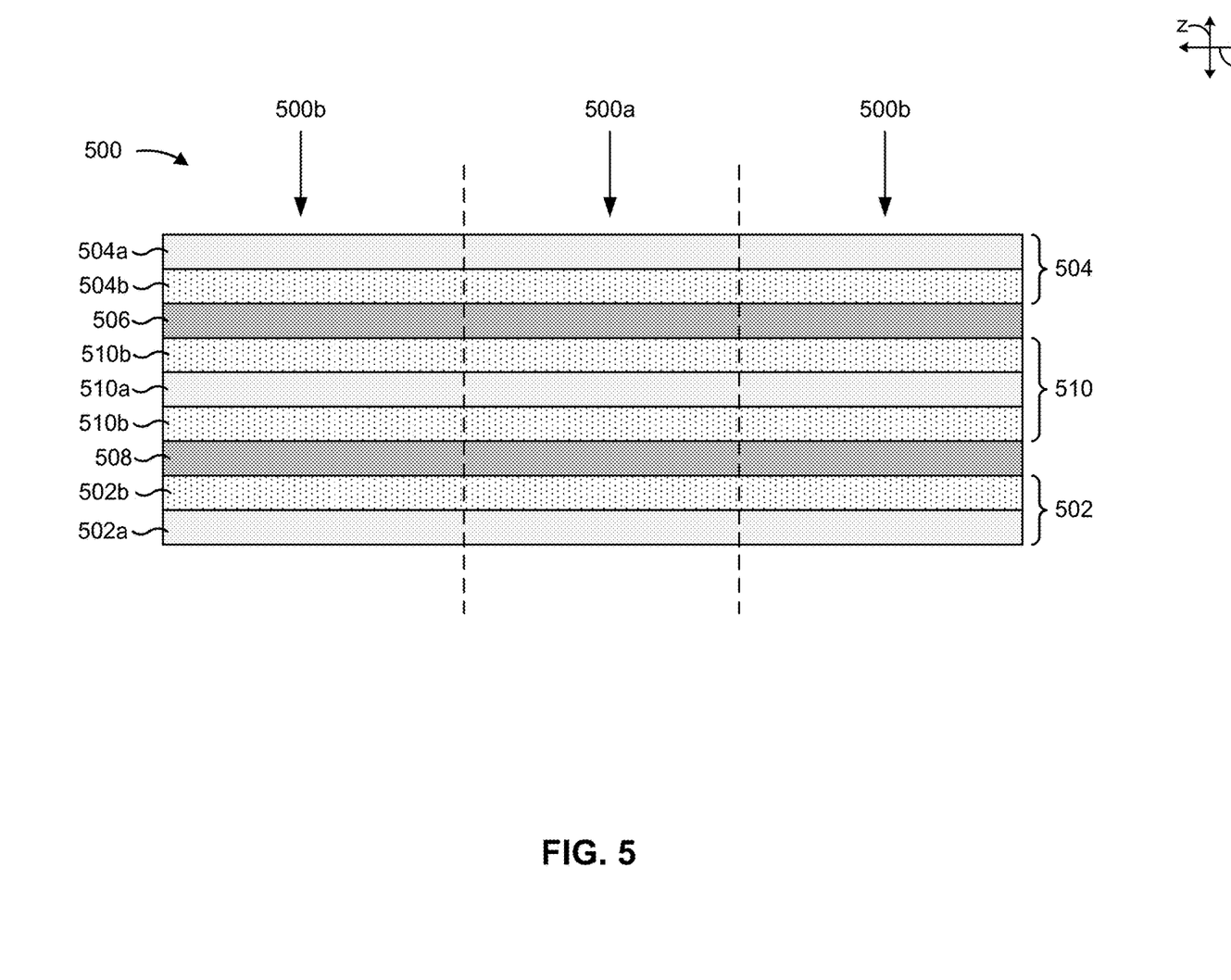
FIG. 5 is a diagram of an example flexible interposer.

FIG. 5 is a diagram of an example flexible interposer 500. In particular, FIG. 5 shows various layers in a cross section of the flexible interposer 500. The flexible interposer 500 may correspond to the flexible interposer 408.

The flexible interposer 500 may include a first flexible layer 502 and a second flexible layer 504. The first flexible layer 502 may be a first coverlay and the second flexible layer 504 may be a second coverlay. For example, the first flexible layer 502 may include a first polymer layer 502a (e.g., a polyimide layer) and a first adhesive layer 502b, and the second flexible layer 504 may include a second polymer layer 504a and a second adhesive layer 504b. A conductive trace 506 (e.g., at least one conductive trace 506) may be disposed between the first flexible layer 502 and the second flexible layer 504 (e.g., between the first adhesive layer 502b and the second adhesive layer 504b). The conductive trace 506 may comprise, consist of, or consist essentially of a metal. For example, the conductive trace 506 may comprise, consist of, or consist essentially of copper. In some implementations, the flexible interposer 500 may include only a single layer for conductive traces, in which case the flexible interposer 500 may include only the first flexible layer 502, the second flexible layer 504, and the conductive trace 506 of the layers shown in FIG. 5.

In some implementations, the flexible interposer 500 may include multiple layers for conductive traces, as shown. For example, the flexible interposer 500 may include a conductive trace 508 (e.g., at least one conductive trace 508), similar to the conductive trace 506, between the first flexible layer 502 and the second flexible layer 504. Here, the flexible interposer 500 may include a third flexible layer 510 between the first flexible layer 502 and the second flexible layer 504. For example, the third flexible layer 510 may include a polymer layer 510a (e.g., a polyimide layer) that is between adhesive layers 510b. In some implementations, the first flexible layer 502, the second flexible layer 504, and/or the third flexible layer 510 may comprise, consist of, or consist essentially of polyimide. The third flexible layer 510 may be between the conductive trace 506 and the conductive trace 508. In other words, the conductive trace 508 is between the first flexible layer 502 and the third flexible layer 510, and the conductive trace 506 is between the third flexible layer 510 and the second flexible layer 504.

As shown, the flexible interposer 500 may include a spacer portion 500a that is configured to space semiconductor dies in a stacked arrangement, in a similar manner as described in connection with FIG. 4. Moreover, the flexible interposer 500 may include connecting portions 500b that extend from the spacer portion 500a. The connecting portions 500b may be configured to extend beyond edges of the semiconductor dies to provide, via the conductive trace 506 and/or the conductive trace 508, an electrical connection for a semiconductor die of the semiconductor dies, in a similar manner as described in connection with FIG. 4. In some implementations, the first flexible layer 502 and/or the second flexible layer 504 may include an opening (not shown), such as a via, that exposes the conductive trace 506 and/or the conductive trace 508. For example, the conductive trace 506 and/or the conductive trace 508 may be electrically connected to a bond pad (e.g., a bond pad 406) through the opening.

In some implementations, the first flexible layer 502, the second flexible layer 504, and the third flexible layer 510 may each have a thickness of approximately 10 μm. In some implementations, the conductive trace 506 and the conductive trace 508 may each have a thickness of approximately 10 μm. The layers of the flexible interposer 500 are depicted in FIG. 5 as having equal thicknesses for illustration purposes. In practice, the layers may have different relative thicknesses from those shown in FIG. 5. The flexible interposer 500 may have an overall thickness in a range from approximately 30 μm to approximately 50 μm. Thus, the flexible interposer 500 may have a reduced thickness relative to conventional spacers, thereby reducing an overall height of a stacked semiconductor die arrangement and/or providing increased top mold clearance, while still providing sufficient protection for embedded conductive traces (e.g., to prevent damage and/or shorting). In some implementations, DAF, having a total thickness of 10 μm, may be attached to a top and a bottom of the flexible interposer 500.

In some implementations, a flexible material (e.g., polyimide) may be molded around one or more conductive traces to form a flexible interposer. Here, molding the flexible material around the one or more conductive traces may result in a first flexible layer (e.g., above a conductive trace or between the conductive trace and a first semiconductor die) and a second flexible layer (e.g., below the conductive trace or between the conductive trace and a second semiconductor die stacked on the first semiconductor die).

As indicated above, FIG. 5 is provided as an example. Other examples may differ from what is described with regard to FIG. 5.

Figure 6A:
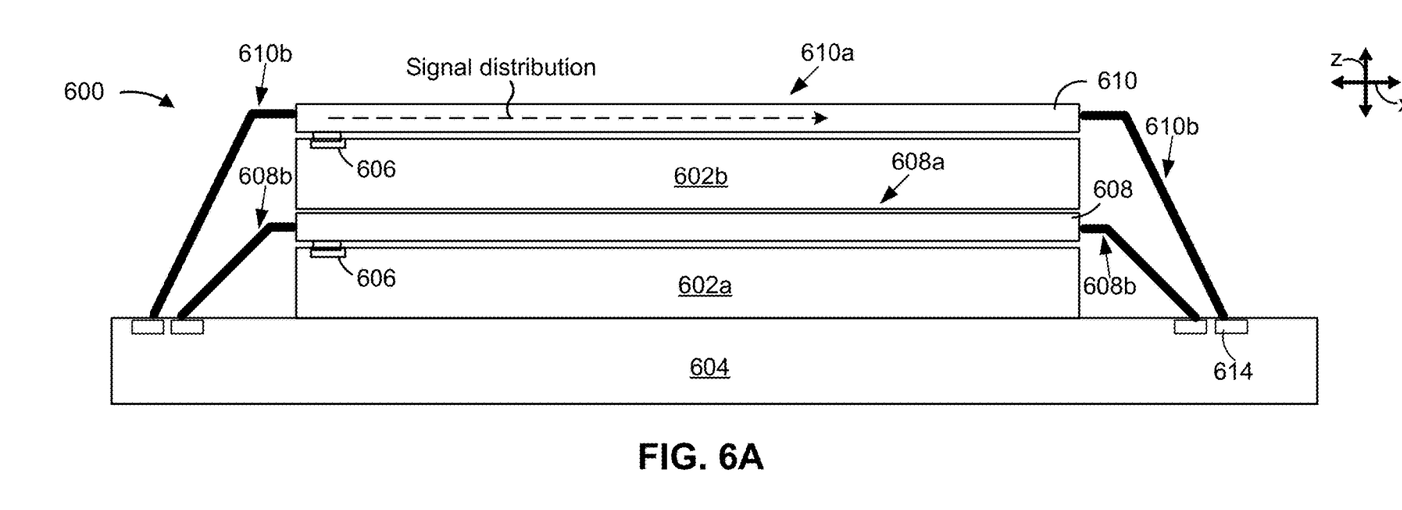
FIGS. 6A-6B are diagrams of an example apparatus that includes a flexible interposer.
Figure 6B:
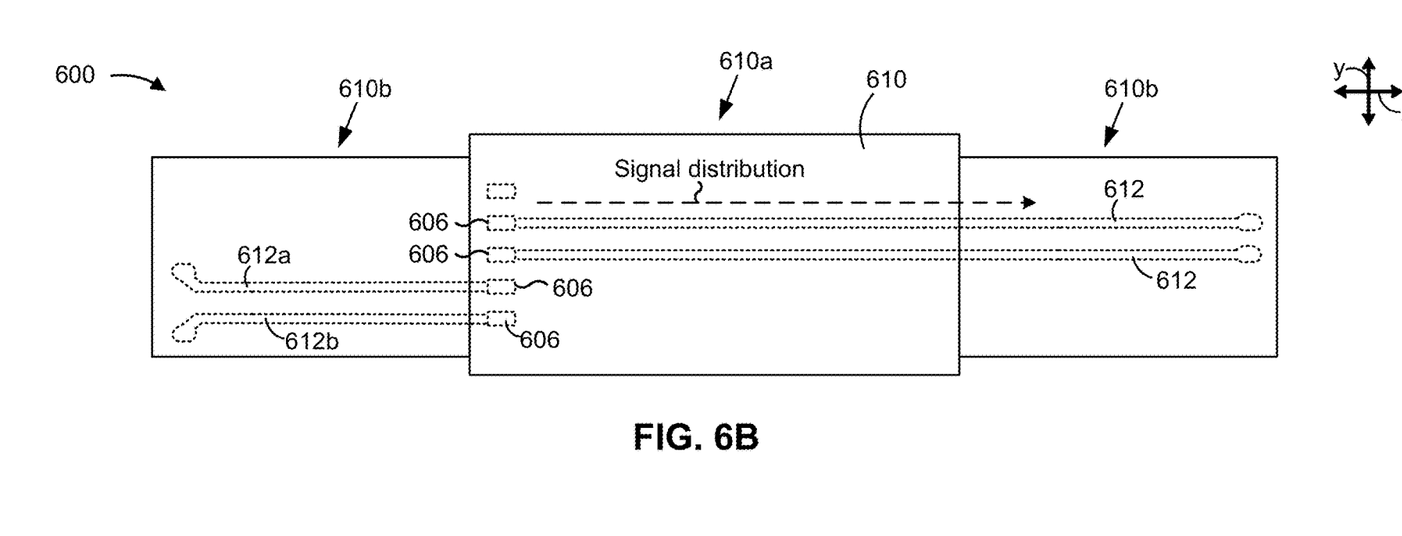

FIGS. 6A-6B are diagrams of an example apparatus 600 that includes a flexible interposer. In particular, FIG. 6A shows a side view of the apparatus 600, and FIG. 6B shows a top view of the apparatus 600. The apparatus 600 may be, or may include, a semiconductor device assembly, as described herein. The apparatus 600 may include a plurality of semiconductor dies 602 in a stacked arrangement. For example, as shown in FIG. 6, the apparatus 600 may include a first semiconductor die 602a, and a second semiconductor die 602b in a stacked arrangement with the first semiconductor die 602a, in a similar manner as described in connection with FIG. 4. In some implementations, the first semiconductor die 602a may be a first memory device and the second semiconductor die 602b may be a second memory device, as described herein. The apparatus 600 may include a substrate 604 (e.g., a circuit board), and the stacked semiconductor dies 602 may be disposed on the substrate 604.

Each of the semiconductor dies 602 may include one or more bond pads 606, in a similar manner as described in connection with FIG. 4. As shown, the bond pads 606 may be nearer to a first edge of a semiconductor die 602 than to a second edge of the semiconductor die 602 that is opposite the first edge (e.g., where a width of the semiconductor die 602 may be defined between the first edge and the second edge). That is, the bond pads 606 may be disposed adjacent to (e.g., within a threshold distance of) the first edge, and there may be no bond pads 606 adjacent to the second edge.

A first flexible interposer 608 may be disposed between the first semiconductor die 602a, in a similar manner as described in connection with FIG. 4. In addition, a second flexible interposer 610 may be in contact with the second semiconductor die 602b. For example, the second flexible interposer 610 may be on top of the second semiconductor die 602b, and the second semiconductor die 602b may be on top (e.g., a top-most die) of a stack of semiconductor dies 602. Each of the flexible interposers 608, 610 may include one or more conductive traces 612 (shown in dashed lines in FIG. 6B to indicate that the conductive traces 612 are embedded in the flexible interposer 610), as described herein. In some implementations, the flexible interposer 608 and/or the flexible interposer 610 may correspond to the flexible interposer 500.

Through the use of the flexible interposers 608, 610, electrical connections between the first semiconductor die 602*a* and the substrate 604 may be free of wire bonding (e.g., there are no wire bonds between the first semiconductor die 602*a* and the substrate 604), and electrical connections between the second semiconductor die 602*b* and the substrate 604 may be free of wire bonding (e.g., there are no wire bonds between the second semiconductor die 602*b* and the substrate 604), as shown. However, in some implementations, the apparatus 600 may have a hybrid configuration, as described herein.

Each of the flexible interposers 608, 610 may have a spacer portion 608*a*, 610*a* and at least one connecting portion 608*b*, 610*b*, as described herein. In some implementations, one or more of the flexible interposers 608, 610 may include a rigid portion between the spacer portion 608*a*, 610*a* and at least one semiconductor die 602, as described further in connection with FIG. 7. For example, the flexible interposer 608 may include a rigid portion between the spacer portion 608*a* of the flexible interposer 608 and at least one of the first semiconductor die 602*a* or the second semiconductor die 602*b*. In some implementations, the rigid portion (e.g., a rigid cover) may be over a spacer portion 608*a*, 610*a*. For example, the rigid portion (e.g., a rigid cover) may be disposed on a top surface of a spacer portion 608*a*, 610*a* and/or a bottom surface of the spacer portion 608*a*, 610*a*. In some implementations, the rigid portion (e.g., a rigid cover) may surround, or partially surround, a spacer portion 608*a*, 610*a*. The rigid portion of a flexible interposer 608, 610 may have greater rigidity than a remaining portion of the flexible interposer 608, 610.

As shown, the flexible interposer 610 may be configured to distribute a signal, at a bond pad 606 that is nearer to the first edge of the semiconductor die 602*b*, past the second edge of the semiconductor die 602*b*. In particular, a conductive trace 612 may be configured to distribute a signal between the bond pad 606, that is nearer to the first edge of the semiconductor die 602*b*, and a pad 614, on the substrate 604, that is nearer to the second edge of the semiconductor die 602*b* than the first edge. For example, the conductive trace 612 may extend from the bond pad 606 and past the second edge of the semiconductor die 602*b* to the corresponding pad 614 on the substrate 604. Signal distribution by the flexible interposer 610 eliminates the need for complex signal routing through the substrate 604 and/or provides greater freedom with respect to the placement of the stacked semiconductor dies 602 and/or other components on the substrate 604, which otherwise would not be possible using wire bonding. The flexible interposer 608 may also be configured to distribute a signal in a similar manner as described for the flexible interposer 610.

In some implementations, the flexible interposer 610 may include a first conductive trace 612*a* and a second conductive trace 612*b* that is adjacent to (e.g., next to, but not touching, and with no intervening conductive traces) the first conductive trace 612*a*, as shown in FIG. 6B. Lengths of the first conductive trace 612*a* and the second conductive trace 612*b* may be matched to provide impedance matching of the first conductive trace 612*a* and the second conductive trace 612*b*. By matching the impedance, the performance of signals in the conductive traces 612*a*, 612*b* may be improved. Moreover, length matching of the conductive traces 612*a*, 612*b* in the flexible interposer eliminates the need for complex length compensation in the substrate 604. The flexible interposer 608 may also be configured with length matched conductive traces in a similar manner as described for the flexible interposer 610.

In some implementations, a first flexible trace in a flexible interposer may have a width that is different from a width of a second flexible trace in the flexible interposer. For example, the flexible interposer may include conductive traces of variable width, and the widths of the conductive traces may be optimized for increasing power capacity and minimizing signal loss. In some implementations, one or more conductive traces in a flexible interposer may be configured in a pattern (e.g., a non-linear pattern), such as a zig-zag pattern, a spiral pattern, or the like.

As indicated above, FIGS. 6A-6B are provided as an example. Other examples may differ from what is described with regard to FIGS. 6A-6B.

Figure 7:
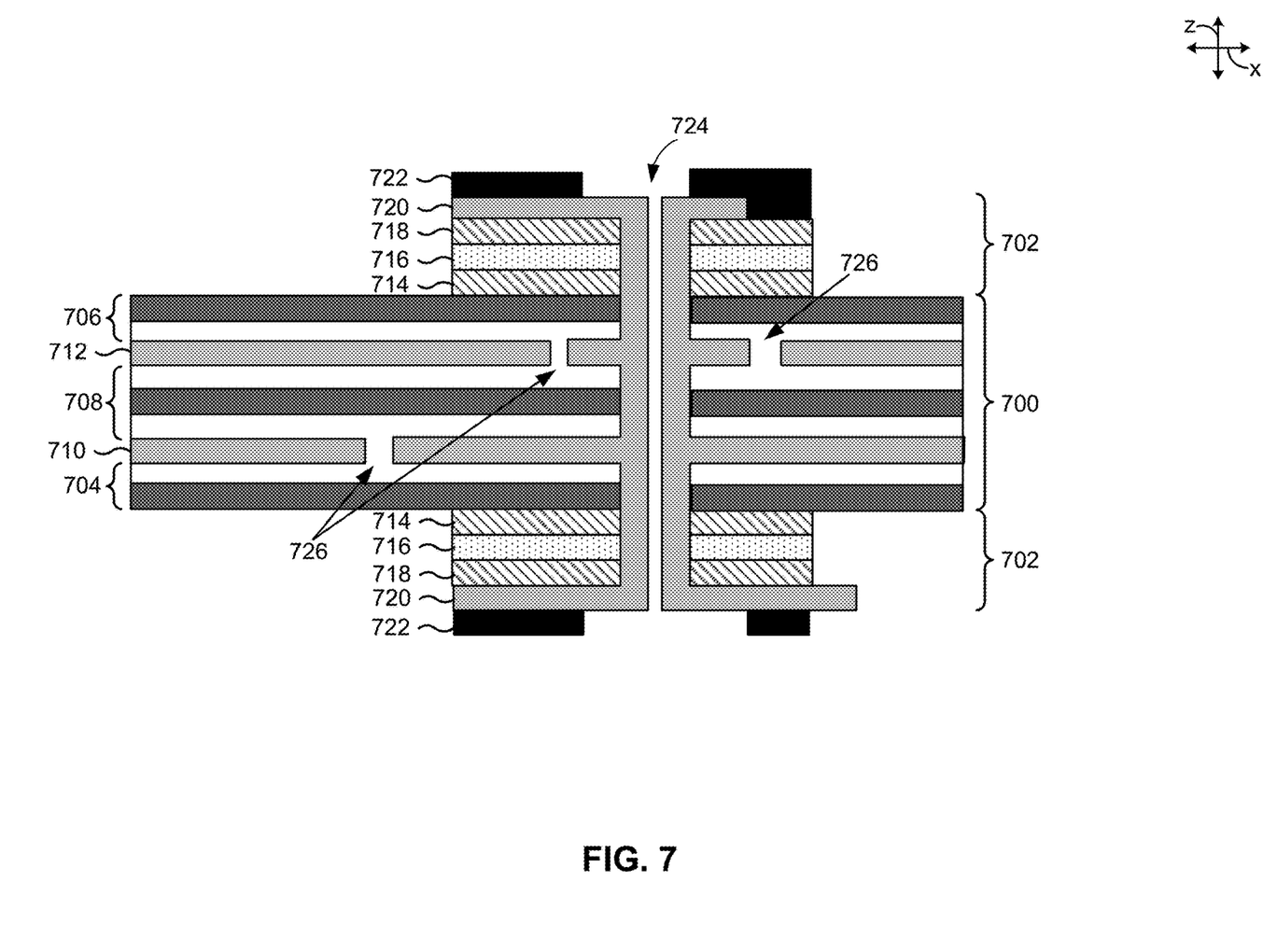
FIG. 7 is a diagram of an example flexible interposer with one or more rigid portions.

FIG. 7 is a diagram of an example flexible interposer 700 with one or more rigid portions 702. In particular, FIG. 7 shows the various layers in a cross section of the flexible interposer 700 and the rigid portions 702. The flexible interposer 700 with the rigid portions 702 may correspond to the flexible interposer 408, the flexible interposer 608, and/or the flexible interposer 610.

As shown, the flexible interposer 700 may include a first flexible layer 704, a second flexible layer 706, a third flexible layer 708, a first conductive trace 710 between the first flexible layer 704 and the third flexible layer 708, and a second conductive trace 712 between the third flexible layer 708 and the second flexible layer 706, in a similar manner as described in connection with FIG. 5. A rigid portion 702, disposed on the top and/or the bottom of the flexible interposer 700, may comprise, consist of, or consist essentially of a pre-impregnated (pre-preg) material or a glass epoxy laminate material (e.g., a glass-reinforced epoxy laminate material, such as FR-4). For example, the rigid portion 702 may include a pre-preg layer 714, a glass epoxy laminate (e.g., FR-4) layer 716, a pre-preg layer 718, a conductive layer 720 (e.g., a metal layer, such as a copper layer), and/or a solder mask layer 722. In some implementations, a via 724 may extend through the rigid portion(s) 702 and the flexible interposer 700. The conductive layer 720 may line the via 724 and electrically connect to the conductive traces 710, 712. In addition, the flexible interposer 700 may include one or more vias 726.

As indicated above, FIG. 7 is provided as an example. Other examples may differ from what is described with regard to FIG. 7.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

Figure 8:
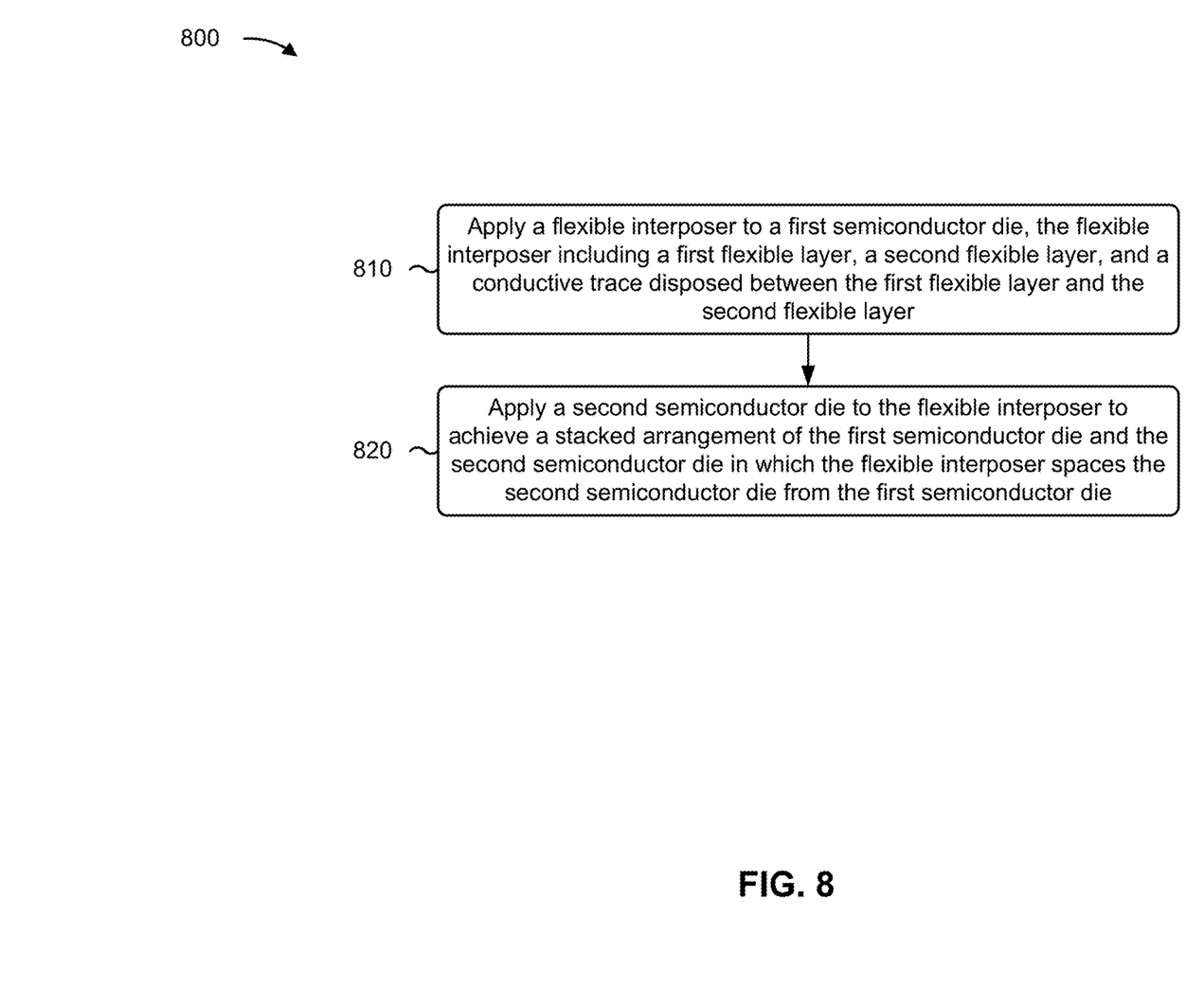
FIG. 8 is a flowchart of an example method of forming an integrated assembly or memory device having a flexible interposer.

FIG. 8 is a flowchart of an example method 800 of forming an integrated assembly or memory device having a flexible interposer. In some implementations, one or more process blocks of FIG. 8 may be performed by various semiconductor manufacturing equipment or other manufacturing equipment.

As shown in FIG. 8, the method 800 may include applying (e.g., disposing) a flexible interposer to a first semiconductor die, the flexible interposer including a first flexible layer, a second flexible layer, and a conductive trace disposed between the first flexible layer and the second flexible layer (block 810). As further shown in FIG. 8, the method 800 may include applying (e.g., disposing) a second semiconductor die to the flexible interposer to achieve a stacked arrangement of the first semiconductor die and the second semiconductor die in which the flexible interposer spaces the second semiconductor die from the first semiconductor die (block 820).

The method 800 may include additional implementations, such as any single implementation or any combination of implementations described below and/or in connection with one or more other methods described elsewhere herein.

In some implementations, the method 800 includes disposing the first semiconductor die on a substrate.

In some implementations, the method 800 includes electrically connecting at least one of the first semiconductor die or the second semiconductor die to a substrate via the conductive trace.

In some implementations, the method 800 includes forming a bond pad on a surface of the first semiconductor die, and the flexible interposer is applied to the first semiconductor die to electrically connect the conductive trace to the bond pad via an opening in at least one of the first flexible layer or the second flexible layer.

In some implementations, applying the flexible interposer to the first semiconductor die includes applying the first flexible layer to the first semiconductor die, applying the conductive trace to the first flexible layer, and applying the second flexible layer to the conductive trace.

In some implementations, the method 800 includes applying the conductive trace to the first flexible layer and applying the second flexible layer to the conductive trace to form the flexible interposer, and applying the flexible interposer to the first semiconductor die includes applying the flexible interposer that is formed to the first semiconductor die.

Although FIG. 8 shows example blocks of the method 800, in some implementations, the method 800 may include additional blocks, fewer blocks, different blocks, or differently arranged blocks than those depicted in FIG. 8. In some implementations, the method 800 may include forming the apparatus 400 and/or 600, an integrated assembly that includes the apparatus 400 and/or 600, any part described herein of the apparatus 400 and/or 600, and/or any part described herein of an integrated assembly that includes the apparatus 400 and/or 600. For example, the method 800 may include forming one or more of the parts 408, 500, 608, 610, 700, and/or 702.

Figure 9:
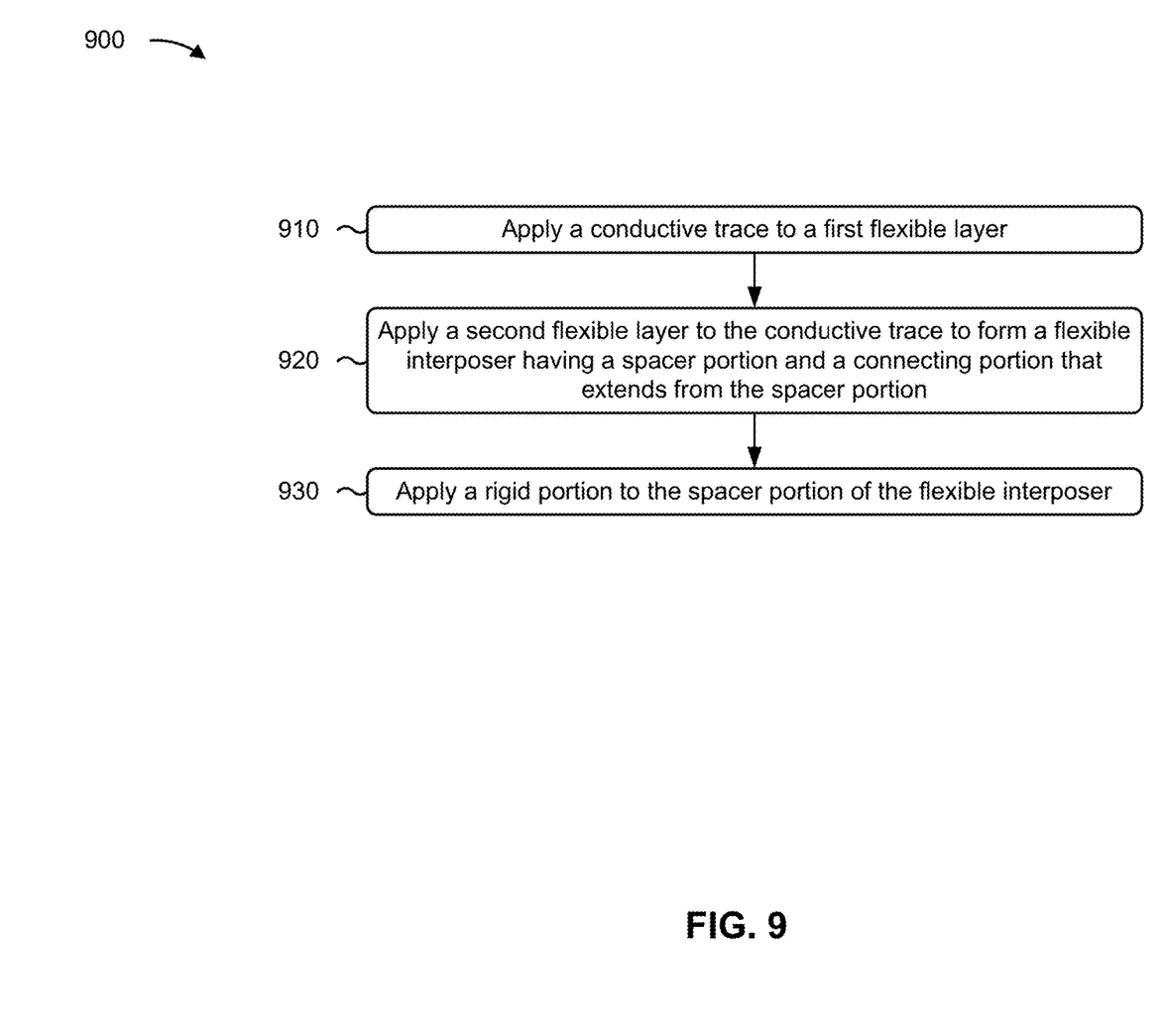
FIG. 9 is a flowchart of an example method of forming a flexible interposer.

FIG. 9 is a flowchart of an example method 900 of forming a flexible interposer. In some implementations, one or more process blocks of FIG. 9 may be performed by various semiconductor manufacturing equipment or other manufacturing equipment.

As shown in FIG. 9, the method 900 may include applying a conductive trace to a first flexible layer (block 910). As further shown in FIG. 9, the method 900 may include applying a second flexible layer to the conductive trace to form a flexible interposer having a spacer portion and a connecting portion that extends from the spacer portion (block 920). As further shown in FIG. 9, the method 900 may include applying a rigid portion to the spacer portion of the flexible interposer (block 930).

The method 900 may include additional implementations, such as any single implementation or any combination of implementations described below and/or in connection with one or more other methods described elsewhere herein.

In some implementations, the rigid portion comprises, consists of, or consists essentially of at least one of a pre-impregnated material or a glass epoxy laminate material.

In some implementations, applying the rigid portion comprises applying a first pre-impregnated material layer to the spacer portion of the flexible interposer, applying a glass epoxy laminate material layer to the first pre-impregnated material layer, and applying a second pre-impregnated material layer to the glass epoxy laminate material layer.

In some implementations, the method 900 includes applying a solder mask layer on the second pre-impregnated material layer.

Although FIG. 9 shows example blocks of the method 900, in some implementations, the method 900 may include additional blocks, fewer blocks, different blocks, or differently arranged blocks than those depicted in FIG. 9. In some implementations, the method 900 may include forming the flexible interposer 408, 500, 608, 610, 700, and/or 702 an integrated assembly that includes the flexible interposer 408, 500, 608, 610, 700, and/or 702, any part described herein of the flexible interposer 408, 500, 608, 610, 700, and/or 702, and/or any part described herein of an integrated assembly that includes the flexible interposer 408, 500, 608, 610, 700, and/or 702.

In some implementations, a semiconductor device assembly includes a first semiconductor die; a second semiconductor die in a stacked arrangement with the first semiconductor die; and a flexible interposer disposed between the first semiconductor die and the second semiconductor die, including: a first flexible layer; a second flexible layer; and a conductive trace disposed between the first flexible layer and the second flexible layer, where a spacer portion of the flexible interposer spaces the first semiconductor die from the second semiconductor die, and where a connecting portion of the flexible interposer extends from the spacer portion beyond edges of the first semiconductor die and the second semiconductor die.

In some implementations, an apparatus includes a substrate; a first semiconductor die; a bond pad, for the first semiconductor die, on a surface of the first semiconductor die; a second semiconductor die in a stacked arrangement with the first semiconductor die; and a flexible interposer, disposed between the first semiconductor die and the second semiconductor die, including a conductive trace embedded in the flexible interposer, where the flexible interposer has an opening through which the conductive trace is electrically connected to the bond pad, where a spacer portion of the flexible interposer spaces the first semiconductor die from the second semiconductor die, and where a connecting portion of the flexible interposer extends from the spacer portion beyond edges of the first semiconductor die and the second semiconductor die, the conductive trace extending within the connecting portion and electrically connected to the substrate.

In some implementations, a memory device includes a semiconductor die; and a flexible interposer, in contact with the semiconductor die, including: a first flexible layer; a second flexible layer; and a conductive trace disposed between the first flexible layer and the second flexible layer, the conductive trace being electrically connected to the semiconductor die.

In some implementations, a flexible interposer includes a first flexible layer; a second flexible layer; and a conductive trace disposed between the first flexible layer and the second flexible layer, the flexible interposer having: a spacer portion configured to space semiconductor dies in a stacked arrangement; and a connecting portion extending from the spacer portion and configured to extend beyond edges of the semiconductor dies to provide, via the conductive trace, an electrical connection for a semiconductor die of the semiconductor dies.

In some implementations, a method includes applying a flexible interposer to a first semiconductor die, the flexible interposer including: a first flexible layer; a second flexible layer; and a conductive trace disposed between the first flexible layer and the second flexible layer; and applying a second semiconductor die to the flexible interposer to achieve a stacked arrangement of the first semiconductor die and the second semiconductor die in which the flexible interposer spaces the second semiconductor die from the first semiconductor die.

In some implementations, a method includes applying a conductive trace to a first flexible layer; applying a second flexible layer to the conductive trace to form a flexible interposer having a spacer portion and a connecting portion that extends from the spacer portion; and applying a rigid portion to the spacer portion of the flexible interposer.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement."

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:
   a first semiconductor die;
   a second semiconductor die in a stacked arrangement with the first semiconductor die; and
   a flexible interposer disposed between the first semiconductor die and the second semiconductor die, comprising:
     a first flexible layer;
     a second flexible layer; and
     a conductive trace disposed between the first flexible layer and the second flexible layer,
       wherein a spacer portion of the flexible interposer spaces the first semiconductor die from the second semiconductor die, and
       wherein a connecting portion of the flexible interposer extends from the spacer portion beyond edges of the first semiconductor die and the second semiconductor die.

2. The semiconductor device assembly of claim 1, wherein the first flexible layer includes a first polymer layer and a first adhesive layer, and the second flexible layer includes a second polymer layer and a second adhesive layer, and
   wherein the conductive trace is between the first adhesive layer and the second adhesive layer.

3. The semiconductor device assembly of claim 1, further comprising a rigid portion between the spacer portion of the flexible interposer and at least one of the first semiconductor die or the second semiconductor die.

4. The semiconductor device assembly of claim 3, wherein the rigid portion comprises, consists of, or consists essentially of at least one of a pre-impregnated material or a glass epoxy laminate material.

5. The semiconductor device assembly of claim 1, wherein the connecting portion is a first connecting portion and the flexible interposer has a second connecting portion that extends from the spacer portion beyond edges of the first semiconductor die and the second semiconductor die, and
   wherein the spacer portion is between the first connecting portion and the second connecting portion.

6. The semiconductor device assembly of claim 5, wherein the conductive trace is a first conductive trace and the flexible interposer further comprises a second conductive trace, and wherein the first conductive trace extends within the first connecting portion and the second conductive trace extends within the second connecting portion.

7. The semiconductor device assembly of claim 1, wherein the flexible interposer has a thickness in a range from approximately 30 micrometers to approximately 50 micrometers.

8. The semiconductor device assembly of claim 1, further comprising:

a bond pad, for the first semiconductor die, on a surface of the first semiconductor die,
   wherein at least one of the first flexible layer or the second flexible layer has an opening through which the conductive trace is electrically connected to the bond pad.

9. The semiconductor device assembly of claim 8, wherein the conductive trace is electrically connected to the bond pad by tape-automated bonding.

10. The semiconductor device assembly of claim 1, wherein the first semiconductor die comprises a first memory device and the second semiconductor die comprises a second memory device.

11. An apparatus, comprising:

a substrate;
a first semiconductor die;
a bond pad, for the first semiconductor die, on a surface of the first semiconductor die;
a second semiconductor die in a stacked arrangement with the first semiconductor die; and
a flexible interposer, disposed between the first semiconductor die and the second semiconductor die, comprising a conductive trace embedded in the flexible interposer,
   wherein the flexible interposer has an opening through which the conductive trace is electrically connected to the bond pad,
   wherein a spacer portion of the flexible interposer spaces the first semiconductor die from the second semiconductor die, and
   wherein a connecting portion of the flexible interposer extends from the spacer portion beyond edges of the first semiconductor die and the second semiconductor die, the conductive trace extending within the connecting portion and electrically connected to the substrate.

12. The apparatus of claim 11, wherein the flexible interposer further comprises:

a first flexible layer; and
a second flexible layer,
   wherein the conductive trace is disposed between the first flexible layer and the second flexible layer.

13. The apparatus of claim 11, wherein the bond pad is nearer to a first edge of the first semiconductor die than a second edge of the first semiconductor die that is opposite the first edge, and wherein the conductive trace is configured to distribute a signal between the bond pad and a pad, on the substrate, that is nearer to the second edge of the first semiconductor die than the first edge of the first semiconductor die.

14. The apparatus of claim 11, wherein the bond pad is nearer to a first edge of the first semiconductor die than a second edge of the first semiconductor die that is opposite the first edge, and wherein the conductive trace extends from the bond pad and past the second edge to a corresponding pad on the substrate.

15. The apparatus of claim 11, wherein the conductive trace is a first conductive trace and the flexible interposer further comprises a second conductive trace adjacent to the first conductive trace, and wherein lengths of the first conductive trace and the second conductive trace are matched to provide impedance matching of the first conductive trace and the second conductive trace.

16. The apparatus of claim 11, wherein electrical connections between the first semiconductor die and the substrate are free of wire bonding, and wherein electrical connections between the second semiconductor die and the substrate are free of wire bonding.

17. The apparatus of claim 11, wherein the connecting portion extends to the substrate, and wherein the conductive trace, extending within the connecting portion, is electrically connected with a pad on the substrate.

18. The apparatus of claim 11, wherein the conductive trace is electrically connected to the substrate by tape-automated bonding.

19. A memory device, comprising:

a semiconductor die; and
a flexible interposer, in contact with the semiconductor die, comprising:
   a first flexible layer;
   a second flexible layer; and
   a conductive trace disposed between the first flexible layer and the second flexible layer, the conductive trace being electrically connected to the semiconductor die.

20. The memory device of claim 19, wherein the memory device further comprises:

a bond pad, for the semiconductor die, on a surface of the semiconductor die,
   wherein at least one of the first flexible layer or the second flexible layer has an opening through which the conductive trace is electrically connected to the bond pad.

21. The memory device of claim 20, wherein the bond pad is adjacent a first edge of the semiconductor die, and wherein the flexible interposer is configured to distribute a signal at the bond pad past a second edge of the semiconductor die that is opposite the first edge.

22. The memory device of claim 19, wherein the memory device further comprises:

an additional semiconductor die,
   wherein the flexible interposer is disposed between the semiconductor die and the additional semiconductor die.

23. The memory device of claim 19, wherein the semiconductor die is on top of a stack of semiconductor dies included in the memory device, and wherein the flexible interposer is on top of the semiconductor die.

24. A flexible interposer, comprising:

a first flexible layer;
a second flexible layer; and a conductive trace disposed between the first flexible layer and the second flexible layer, the flexible interposer having:
- a spacer portion configured to provide vertical separation between semiconductor dies in a stacked arrangement; and
- a connecting portion extending from the spacer portion and configured to extend beyond edges of the semiconductor dies to provide, via the conductive trace, an electrical connection for a semiconductor die of the semiconductor dies.

25. The flexible interposer of claim 24, wherein at least one of the first flexible layer or the second flexible layer has an opening that exposes the conductive trace.

26. The flexible interposer of claim 24, further comprising:
a third flexible layer between the first flexible layer and the second flexible layer,
wherein at least one first conductive trace, of a plurality of conductive traces, is between the first flexible layer and the third flexible layer, and at least one second conductive trace, of the plurality of conductive traces, is between the third flexible layer and the second flexible layer.

27. The flexible interposer of claim 24, wherein the conductive trace is a first conductive trace and the flexible interposer comprises a second conductive trace adjacent to the first conductive trace, and
wherein lengths of the first conductive trace and the second conductive trace are matched to provide impedance matching of the first conductive trace and the second conductive trace.

28. The flexible interposer of claim 24, wherein the first flexible layer and the second flexible layer each comprise, consist of, or consist essentially of polyimide, and
wherein the conductive trace comprises, consists of, or consists essentially of copper.

29. The flexible interposer of claim 24, further comprising a rigid cover over the spacer portion.

30. A method, comprising:
applying a flexible interposer to a first semiconductor die, the flexible interposer including:
- a first flexible layer;
- a second flexible layer; and
- a conductive trace disposed between the first flexible layer and the second flexible layer; and
applying a second semiconductor die to the flexible interposer to achieve a stacked arrangement of the first semiconductor die and the second semiconductor die in which the flexible interposer spaces the second semiconductor die from the first semiconductor die.

31. The method of claim 30, further comprising:
disposing the first semiconductor die on a substrate.

32. The method of claim 30, further comprising:
electrically connecting at least one of the first semiconductor die or the second semiconductor die to a substrate via the conductive trace.

33. The method of claim 30, further comprising:
forming a bond pad on a surface of the first semiconductor die,
wherein the flexible interposer is applied to the first semiconductor die to electrically connect the conductive trace to the bond pad via an opening in at least one of the first flexible layer or the second flexible layer.

34. The method of claim 30, wherein applying the flexible interposer to the first semiconductor die comprises:
applying the first flexible layer to the first semiconductor die;
applying the conductive trace to the first flexible layer; and
applying the second flexible layer to the conductive trace.

35. The method of claim 30, further comprising:
applying the conductive trace to the first flexible layer; and
applying the second flexible layer to the conductive trace to form the flexible interposer,
wherein applying the flexible interposer to the first semiconductor die comprises applying the flexible interposer that is formed to the first semiconductor die.

* * * * *